---

United States Patent [19]

Van Etten

[11] 4,070,636

[45] Jan. 24, 1978

[54] PLURAL LOOP SPARK GAP RF PULSE RADIATION CONVERTER

[75] Inventor: Paul Van Etten, Clinton, N.Y.

[73] Assignee: The United States of America as represented by the Secretary of the Air Force, Washington, D.C.

[21] Appl. No.: 744,499

[22] Filed: Nov. 24, 1976

[51] Int. Cl.² .............................................. H03B 11/02
[52] U.S. Cl. .................................... 331/127; 325/106; 331/128; 343/701; 343/755
[58] Field of Search ................................ 331/126–128; 343/701, 755; 325/106, 107; 332/8; 307/106, 108

[56] References Cited

U.S. PATENT DOCUMENTS

| 3,011,051 | 11/1961 | Landecker | 325/106 X |
| 3,906,252 | 9/1975 | Van Etten | 331/127 X |

*Primary Examiner*—Siegfried H. Grimm
*Attorney, Agent, or Firm*—Joseph E. Rusz; George Fine

[57] ABSTRACT

The high-power, short-pulse array is a self-contained radiating oscillator system which radiates a high peak-power pulse of radio frequency energy. The radiated pulses contain only a few cycles of RF and hence it is a short-pulse emitter. The device contains a chain or a series of loops which radiate in phase and each loop has a spark gap. The spark gaps are sequentially fired. The radiated waveform can be a single pulse of RF or a train of RF pulses. The device requires only a high voltage power supply for operation.

5 Claims, 6 Drawing Figures

PLURAL LOOP SPARK GAP RF PULSE RADIATION CONVERTER

STATEMENT OF GOVERNMENT INTEREST

The invention described herein may be manufactured and used by or for the Government for governmental purposes without the payment of any royalty thereon.

BACKGROUND OF THE INVENTION

The high-power, short-pulse array to be described is a radiating oscillator system which radiates high peak power pulses of radio frequency energy. This invention may be named from the word "catena" which means a chain, or series, especially a connected series.

In designing a system to radiate high peak power bursts of RF energy a limiting factor is that the transmitter is peak power limited. This invention overcomes this limitation by employing "N" transmitters where "N" is the number of elements of the antenna. Each element of the array is a "radiating transmitter" in that each element frequency of the loop is determined by a fixed-value capacitor and the inductance of the loop.

Important features of this invention are that the spark gaps are sequentially fired and are synchronously timed by a unique method. Upon proper firing of the spark gaps the energy in each loop is radiated.

The radiated waveform can be a single burst of RF or a train of RF bursts. The carrier frequency is determined by the inductance and capacity of the loop and the pulse repetition frequency is determined by the value of the charging resistors. The only required external circuitry or component is a DC high voltage power supply. If desired the catena array may also be charged with a pulse modulator if a DC high voltage supply is not available.

In devices or oscillators which contain many tuned circuits coupling between each of these tuned circuits will affect the output frequency and may result in multiple frequency outputs. A unique feature of this invention is that the output frequency is determined by the capacity and inductance of each loop only.

It is noted that the invention contains no moving parts, magnetic fields, vacuum, modulators, filament power supplies or X-ray shielding and will have a long shelf life. The array is simple to fabricate. It is low cost and lightweight. Its rugged construction will allow the device to be subject to extreme acceleration and shock without damage. The array is capable of broad applications including radar, beacons, air-sea rescue, missile and space-born illuminators and pulse jammers.

SUMMARY OF THE INVENTION

A high power, short-pulse array is provided. Essentially it is a radiating oscillator system of the spark-gap type. It includes a plurality of radiating loops, each of which has a charging circuit and a spark gap. The array is designed so that the gap in the first loop fires first. The resulting step waveform causes the second gap to fire, which in turn causes the third gap to fire, etc., thereby radiating a single pulse of RF or a train of RF pulses. The array requires only a high voltage power supply for operation.

DETAILED DESCRIPTION OF THE PREFERRED EMBODIMENTS

Figure 1:
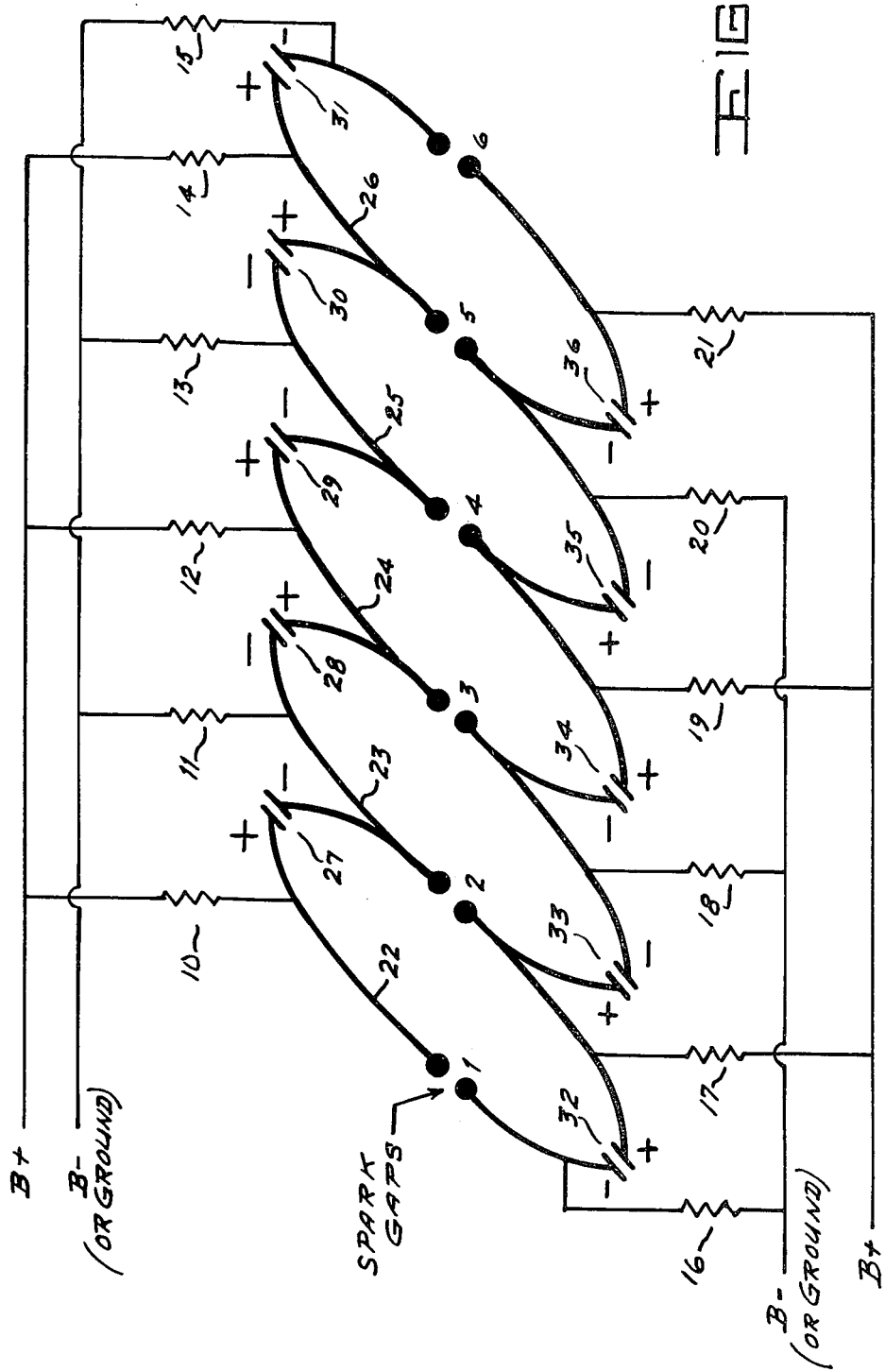
FIG. 1 is an isometric diagram of the array with parallel charging.

The operation of the high-power, short-pulse array is now explained with the aid of FIG. 1. For this example, five loops 22-26 are shown with the charging circuit for each loop. Every other gap is reverse charged, that is, gaps 1, 3 and 5 are charged in opposite polarity with gaps 2, 4 and 6. When the high voltage is applied the loops start charging up. It is required that gap 1 fire first. This can be accomplished by two means. First, the gap spacing can be adjusted smaller than the rest of the gaps so that it will fire first. The other means is to choose the value of resistors 10 and 16 in FIG. 1 to be a smaller value of resistance than the rest of the charging resistors 11-15 and 17-21. Under this condition the voltage across gap 1 will fire first. A combination of the above two may also be employed in a given design.

The loops continue to charge until gap 1 fires (switches). When this switch is closed, two step waveforms travel away from the gap around the loop. The waveforms will pass through capacitors 27 and 32 in FIG. 1 as they may be considered to be coupling capacitors. Then the step waveforms appear at gap 2 causing it to fire. An important feature of this invention is the employment of the capacitors, which in turn allow the gaps to be reverse polarized and hence achieve overvolting. If capacitors 27-32 were not used the step waveform would undervolt the next gap and it would not fire.

At this point in time gaps 1 and 2 are closed and first loop 22 will ring down at a resonance frequency determined by the capacitors 27 and 32 and the inductance of the loop. While this oscillatory current is circulating around the loop radiation will occur.

Figure 2:
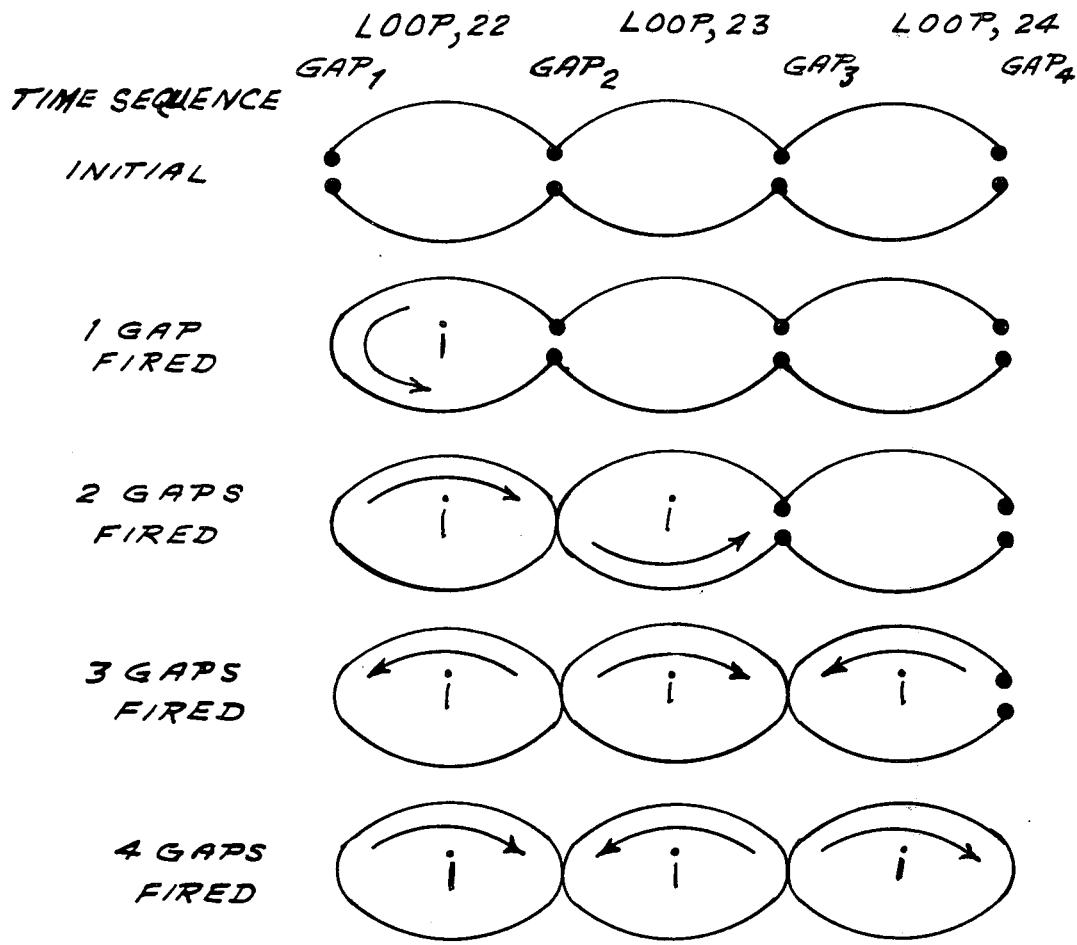
FIG. 2 is a time sequential diagram of gap firing and loop currents for FIG. 1.

When gap 2 fires, a set of step waveforms start to travel down loop 23 and will fire gap 3 as described above for the first loop. In the same manner all of the gaps will fire in sequence. A sequential timing diagram is shown in FIG. 2. Notice that the oscillating circulating currents in any loop are out of phase with currents in each adjacent loop.

Figure 3:
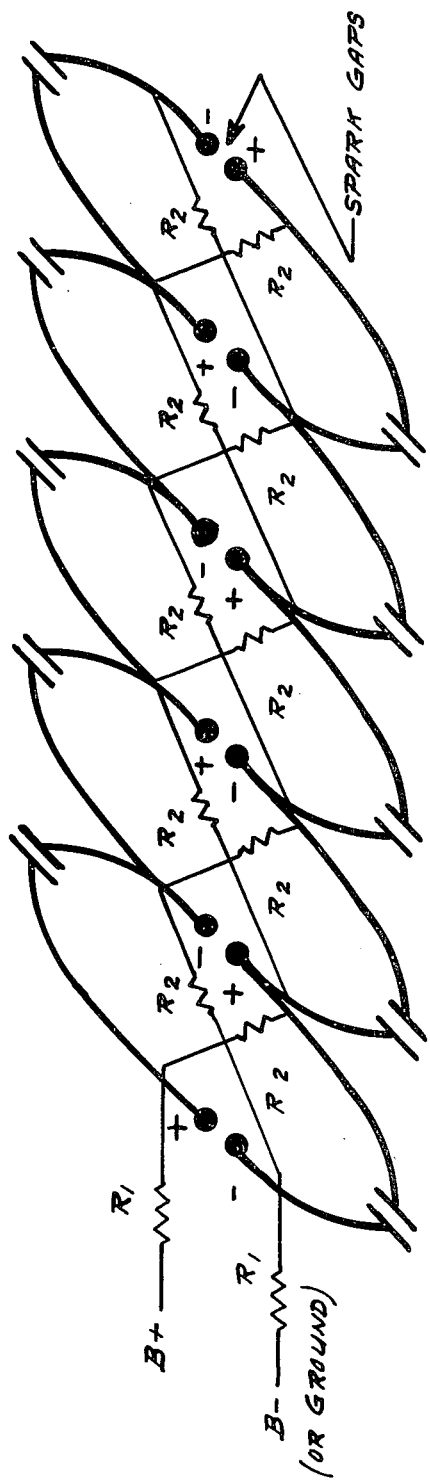
FIG. 3 shows an array with another charging circuit.

The DC charging circuit of FIG. 1 is just an example of how one may charge the loops. Another charging circuit is shown in FIG. 3. In this charging circuit the value of R1 is generally much larger than the values of the R2's. This charging circuit has the advantage that the first gap will always be charged to the greatest voltage.

Once the array has been charged by the power supplies and the gaps fire, the loops will again charge up in voltage through the charging resistors. Since the equivalent capacitance of the loop is dictated by the desired resonance frequency of radiation, the value of the charging resistors can be selected to obtain the desired pulse repetition frequency. As described above the array requires only high voltage DC supplies to obtain a recurring burst of RF.

The manner in which the device generates its PRF is now discussed. Assume that initially the power supply is turned on. Each capacitor is then charged through a resistor. For example, loop 22 of FIG. 1 is charged up until gap 1 fires. After all of the gaps have fired (which is a relatively short time) the capacitors again charge up and the gaps again fire. The charging resistor 10 and the capacitor 27 form a time constant for a relaxation oscillation. The relaxation time period, $\tau$, for typical gap spacing is:

$$\tau = R_1 C_1$$

where $R_1$ = resistor 10 and $C_1$ = capacitor 27; whereas the PRF is the reciprocal of the relaxation time:

$$PRF = 1/\tau = 1/R_1 C_1.$$

For a given carrier frequency the size of the loops will be fixed. In turn the value of $C_1$ will be fixed. For a required PRF the value of $R_1$ is derived by:

$$R_1 = 1/(PRF)\, C.$$

The array as described thus far requires both a negative and positive high voltage power supply. The array will also function if one high voltage input is grounded. This will simplify the supply requirements. However, employing two supplies has the advantage of the same radiated field as a single supply but with a lower voltage to ground. For very high peak powers this will ease voltage breakdown and corona problems.

Figure 4:
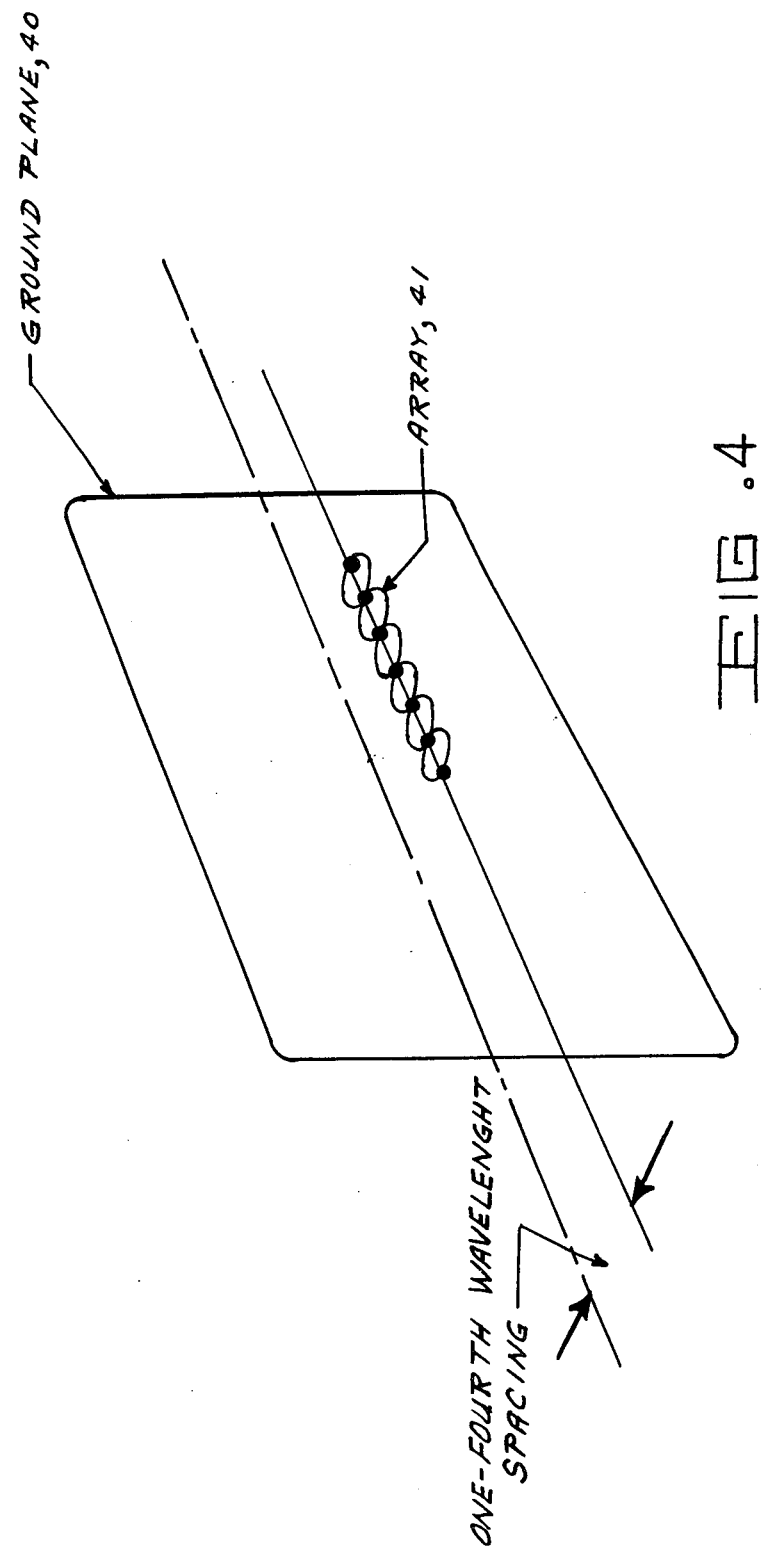
FIG. 4 shows the array of FIG. 1 employed with a ground plane reflector.

The array as described thus far can be employed with other known antenna techniques. An example of combining techniques is employing image ground plane with array. This is shown in FIG. 4 where array 41 is placed one-quarter wavelength in front of ground plane 40.

Figure 5:
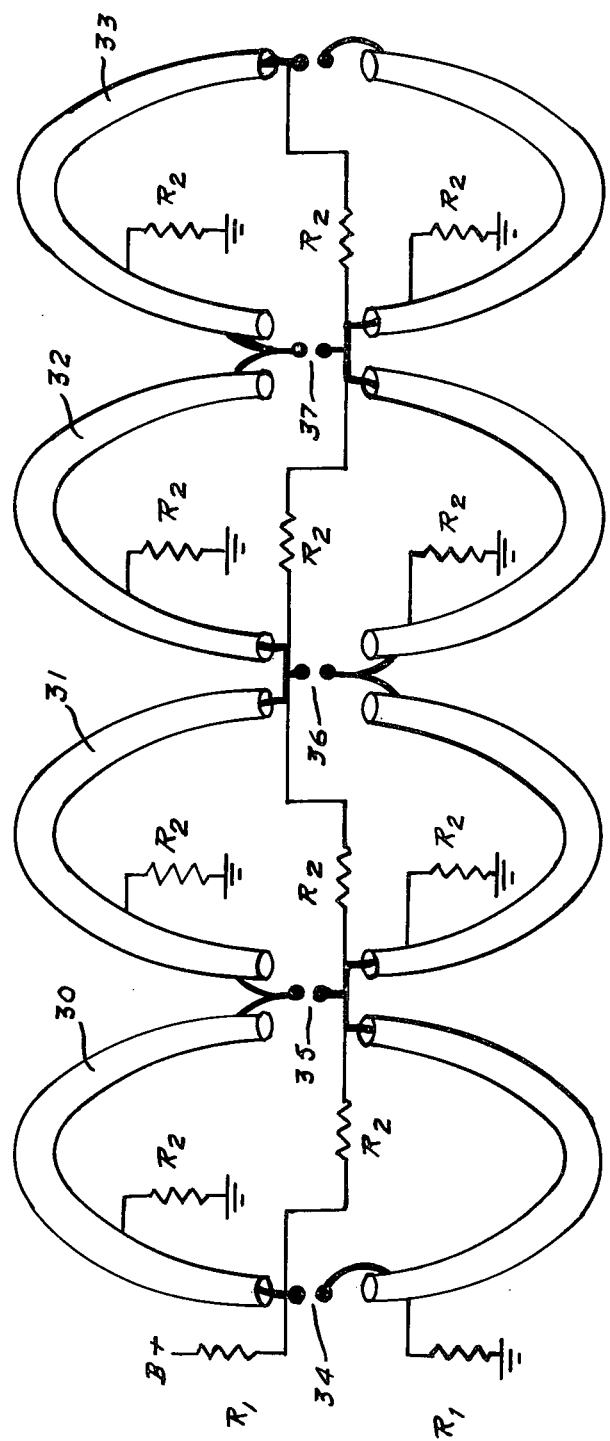
FIG. 5 shows another array with a distributed capacitor.

Another novel feature of this invention is that the fixed lumped-constant capacitors in the loop may be replaced with a distributed capacitor. This may take many forms and an example is shown in FIG. 5. The theory of operation is the same as when employing the lumped constant capacitors. An advantage of this configuration is that the external exposed metal components are near DC ground potential. The resonance frequency of coaxial-line loops 30–33 is determined by the series resonance frequency of the distributed inductance and capacitance of the coaxial cable, where $$f_o = 1/2\pi \sqrt{LC}$$

$f_o$ = resonant frequency
$L$ = inductance in Henrys
$C$ = capacity in Farads

For coaxial transmission lines it is more convenient to use the surge impedance, $Z_o$, and the capacity per foot, $C_f$. Using the relationship:

$$Z_o = L/C$$

and with $S$ = total length of the loop:

$$C = S\, C_f$$

the resonant frequency of the loop is $$f_o = 1/2\pi \sqrt{Z_o\, S\, C_f}.$$

Figure 6:
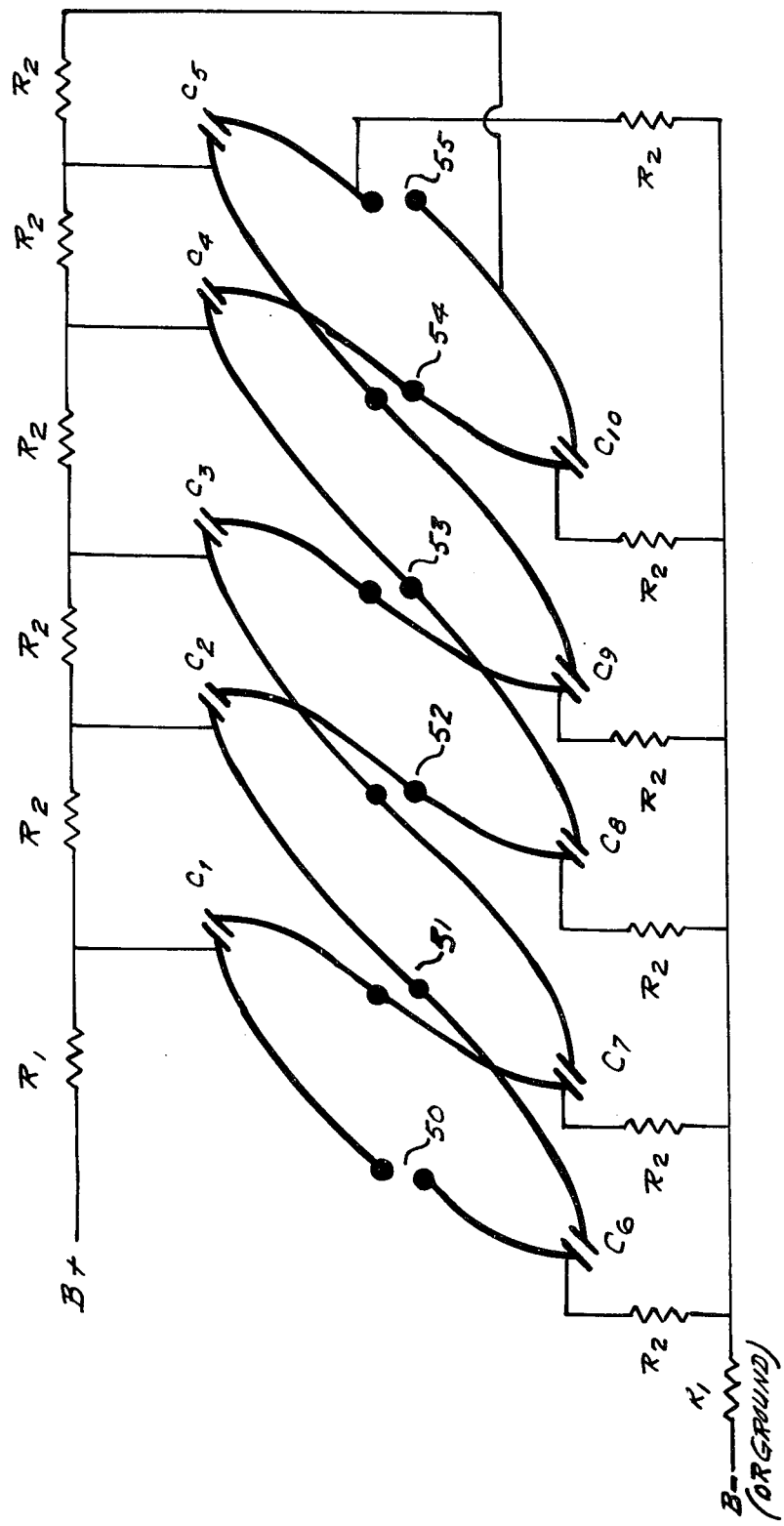
FIG. 6 shows an array of the lumped-constant loop array shown in FIG. 1 wherein every other loop is properly inverted.

The radiation characteristics will now be described. Because the loops are small compared to wavelength of the carrier and every other loop is 180° out of phase, the radiation characteristics would be poor. The discussion of every other loop being out of phase was considered to simplify the description of DC charging of the loop and the sequential firing of gaps 34–37. To complete the idea then, every other loop must be inverted or physically "flipped over." Now all the loops will have circulating currents which are all in phase and radiation will occur. Hence the circulating currents in FIG. 2 are all in phase. The lumped-constant loop array shown in FIG. 1 where every other loop is properly inverted is shown in FIG. 6. The distributed loop array is inverted in a similar manner.

I claim:

1. A high-power, short-pulse array comprised of loops, each connected sequentially in a series arrangement from first to last to radiate in phase, each of said loops having a predetermined inductance, a spark gap from first to last for each of said loops, a charging circuit for each of said loops, and means to apply a high voltage to each of said charging circuits causing the first spark gap to fire with the resulting waveform firing the next spark gap until the firing of the last spark gap to sequentially fire each of said spark gaps thereby providing from said loops radiated waveforms in the form of RF pulses.

2. A high-power, short-pulse array as described in claim 1 wherein each of said charging circuits is comprised of a resistor connected to an associated loop, and first and second capacitors connected in the associated loop allowing said spark gap in the associated loop to be reverse polarized to achieve overvolting.

3. A high-power, short-pulse array as described in claim 2 wherein said first and second capacitors in each loop in conjunction with said inductance in each loop determine the resonant frequency thereof.

4. A high-power, short-pulse array as described in claim 1 further including an image ground plane with said high-power, short-pulse array positioned one-quarter of a wavelength in front thereof.

5. A high-power, short-pulse array as described in claim 1 wherein each of said loops is comprised of a coaxial cable.

* * * * *